(12) United States Patent
Xie et al.

(10) Patent No.: US 11,302,723 B2
(45) Date of Patent: Apr. 12, 2022

(54) ELECTRICAL CONNECTION METHOD, SUBSTRATE AND DISPLAY DEVICE

(71) Applicant: BOE TECHNOLOGY GROUP CO., LTD., Beijing (CN)

(72) Inventors: Dini Xie, Beijing (CN); Wei Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 676 days.

(21) Appl. No.: 16/097,947

(22) PCT Filed: Jan. 17, 2018

(86) PCT No.: PCT/CN2018/073067
§ 371 (c)(1),
(2) Date: Oct. 31, 2018

(87) PCT Pub. No.: WO2019/019572
PCT Pub. Date: Jan. 31, 2019

(65) Prior Publication Data
US 2021/0225899 A1 Jul. 22, 2021

(30) Foreign Application Priority Data
Jul. 28, 2017 (CN) .......................... 201710633443.8

(51) Int. Cl.
*H01L 27/12* (2006.01)
*H01L 21/768* (2006.01)
(Continued)

(52) U.S. Cl.
CPC .... *H01L 27/1259* (2013.01); *H01L 21/76883* (2013.01); *H01L 27/124* (2013.01); *G02F 1/136263* (2021.01); *H01L 21/31133* (2013.01)

(58) Field of Classification Search
CPC ........... H01L 27/1259; H01L 21/76883; H01L 27/124; H01L 21/31133; G02F 1/136263
(Continued)

(56) References Cited

U.S. PATENT DOCUMENTS

| 7,335,081 | B2 * | 2/2008 | Iwaki | H01J 9/027 445/6 |
| 7,714,098 | B2 | 5/2010 | Heeney et al. | |

(Continued)

FOREIGN PATENT DOCUMENTS

| CN | 1341946 A | 3/2002 |
| CN | 1395462 A | 2/2003 |

(Continued)

OTHER PUBLICATIONS

Second Office Action issued by the Chinese Patent Office in the corresponding Chinese application No. 201710633443.8 dated Aug. 25, 2020.

(Continued)

*Primary Examiner* — Ori Nadav
(74) *Attorney, Agent, or Firm* — Dilworth & Barrese, LLP.; Michael J. Musella, Esq.

(57) ABSTRACT

A method for repairing a broken wire, a substrate and a display device are provided. The method is adopted for electrically connecting a first conductive point and a second conductive point separated from each other on a substrate. The method includes: forming a conductive polymer precursor thin film to physically connect the first conductive point and the second conductive point; and performing a polymerizing process on the conductive polymer precursor thin film to form a conductive polymer electrically connecting the first conductive point and the second conductive point.

12 Claims, 6 Drawing Sheets

(51) Int. Cl.
*G02F 1/1362* (2006.01)
*H01L 21/311* (2006.01)

(58) Field of Classification Search
USPC .......................................................... 257/741
See application file for complete search history.

(56) References Cited

U.S. PATENT DOCUMENTS

| | | | |
|---|---|---|---|
| 2005/0110736 A1* | 5/2005 | Jinno | H01L 27/3258 345/92 |
| 2009/0184824 A1 | 7/2009 | Forster | |
| 2011/0227137 A1 | 9/2011 | Nomura et al. | |
| 2014/0008345 A1 | 1/2014 | Cheng | |
| 2018/0233705 A1* | 8/2018 | Xu | H01L 51/5246 |
| 2018/0237656 A1* | 8/2018 | Dai | F28D 1/03 |

FOREIGN PATENT DOCUMENTS

| | | | |
|---|---|---|---|
| CN | 1603919 A | 4/2005 |
| CN | 1956988 A | 5/2007 |
| CN | 101044623 A | 9/2007 |
| CN | 101241876 A | 8/2008 |
| CN | 101965583 A | 2/2011 |
| CN | 102368478 A | 3/2012 |
| CN | 102759829 A | 10/2012 |
| CN | 103257496 A | 8/2013 |
| CN | 106009015 A | 10/2016 |
| JP | 02212811 A | 8/1990 |

OTHER PUBLICATIONS

Xin et. al. "Synthetic Methods for Poly (thiophene)s" 2015, 27(4), p. 385-394.

Tomokazu et. al., "New Method for preparing Poly(benzo[c]thiophene) Thin Films by Photopolymerization", J. Chem. Soc., Chem. Commun., 1991, 1618-1619, Japan.

Yagci et al., "N-Alkoxy-Pyrindinium and N-Alkoxy-Quinolinium Salts as Initiators for Catonic Photopolymerizations", Journal of Polymer Science, 1992, p. 1987-1991, vol. 30.

Rabek et. al. "Polymerization of pyrrol by cationic photoinitiators", Polymer, 1992, p. 4838-4844, vol. 30, No. 22.

International Search Report and Written Opinion dated May 3, 2018 from State Intellectual Property Office of the P.R. China.

* cited by examiner

ELECTRICAL CONNECTION METHOD, SUBSTRATE AND DISPLAY DEVICE

The present application claims priority of Chinese Patent Application No. 201710633443.8 filed on Jul. 28, 2017, the disclosure of which is incorporated herein by reference in its entirety as part of the present application.

TECHNICAL FIELD

Embodiments of the present disclosure relate to a method for repairing a broken wire, a substrate and a display device.

BACKGROUND

A Thin Film Transistor-Liquid Crystal Display (TFT-LCD) is a display device which changes orientations of liquid crystal molecules by changing intensity of an electric field loaded on a liquid crystal molecule layer between upper and lower substrates, so as to control light transmitting intensity to display an image. A liquid crystal display panel usually includes an array substrate, a color filter (CF) substrate and a liquid crystal molecule layer filled in a liquid crystal cell formed by the two substrates. A plurality of pixel units are arranged on the array substrate in an array, and each of the pixel unit includes a TFT; and generally, the TFTs of each row of pixel units are connected with a gate line arranged transversally, and the gate line is used for controlling turning on or off the TFT, and the TFTs of each column of pixel units are connected with a data line arranged longitudinally, and the data line is used for writing a data signal to the pixel unit when the TFT is turned on.

In a process of fabricating the array substrate, because problems of processes or devices may cause lines such as the gate line, the data line or the like to be broken, when the lines have been broken, function of the array substrate may be poor in a certain region, seriously affecting overall performance of the array substrate.

SUMMARY

An embodiment of the present disclosure provides an electrical connection method for electrically connecting a first conductive point and a second conductive point separated from each other on a substrate, including: forming a conductive polymer precursor thin film to physically connect the first conductive point and the second conductive point; and performing a polymerizing process on the conductive polymer precursor thin film to form a conductive polymer electrically connecting the first conductive point and the second conductive point.

In an example, the first conductive point and the second conductive point belong to a same conductive member.

In an example, the conductive polymer precursor thin film is in direct contact with the first conductive point and the second conductive point.

In an example, the polymerizing process is a light irradiating process.

In an example, the conductive polymer precursor thin film includes a conductive polymer precursor material.

In an example, the conductive polymer precursor material includes a mixture of benzothiophene monomer, carbon tetrachloride, tetrabutylammonium bromide and a solvent.

In an example, the conductive polymer precursor material includes a mixture of a photoinitiator and thiophene monomer.

In an example, the conductive polymer precursor thin film further includes an organic resin mixed with the conductive polymer precursor material.

In an example, a mass ratio of the conductive polymer precursor material to the organic resin is about 1:2 to 2:1.

In an example, performing the light irradiating process on the conductive polymer precursor thin film to form the conductive polymer includes: making a light spot formed by irradiating the conductive polymer precursor thin film with a light source move along a connecting line between the first conductive point and the second conductive point.

In an example, the light source is an ultraviolet light source or a laser light source.

In an example, the method further includes: removing an unirradiated portion of the conductive polymer precursor thin film.

In an example, removing the unirradiated portion of the conductive polymer precursor thin film includes: washing the conductive polymer precursor thin film irradiated with light by using an organism stripping solution.

In an example, an insulating layer is covered on the first conductive point and the second conductive point, the repairing method further including: forming a first via hole and a second via hole on the insulating layer before forming the conductive polymer precursor thin film, the first via hole exposing the first conductive point, and the second via hole exposing the second conductive point; the conductive polymer precursor thin film physically connecting the first conductive point and the second conductive point through the first via hole and the second via hole.

In an example, the conductive member is a gate line, a data line, a common line, a gate electrode or a source-drain electrode.

Another embodiment of the present disclosure provides a substrate, including: a first conductive point; a second conductive point; a conductive polymer, connecting the first conductive point and the second conductive point.

In an example, the conductive polymer is obtained by irradiating a mixture of benzothiophene monomer, carbon tetrachloride, tetrabutylammonium bromide and a solvent with light.

In an example, the conductive polymer is obtained by irradiating a mixture of a photoinitiator, epoxide, alkyl vinyl ether and thiophene monomer with light.

In an example, the first conductive point and the second conductive point belong to a same conductive member, the conductive member being selected from a gate line, a data line, a common line, a gate electrode or a source-drain electrode.

Yet another embodiment of the present disclosure provides a display device, including any of the substrates described above.

BRIEF DESCRIPTION OF THE DRAWINGS

In order to clearly illustrate the technical solution of the embodiments of the present disclosure, the drawings used in descriptions of the embodiments will be briefly described in the following; it is obvious that the described drawings are only related to some embodiments of the present disclosure, those ordinarily skilled in the art may further obtain other drawings according to these drawings, without any inventive work.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those ordinarily skilled in the art can obtain other embodiment(s), without any inventive work, which should be within the scope of the present disclosure.

An array substrate repairing technology mainly includes a laser chemical vapor deposition, a laser welding and the like. When the laser chemical vapor deposition is used for repairing a broken wire, the broken wire may be bridged for connecting by a laser chemical vapor deposition device with tungsten powder; when the laser welding is used for repairing the broken wire, the broken wire may be fused with a repair line by a laser fusion machine. The laser chemical vapor deposition device or the laser fusion machine is needed in the repair process described above, resulting in high repair cost, long repair time; if the technologies such as the laser chemical vapor deposition, the laser welding and so on are used, processes of deposition and fusion may affect performance of pixel units around a broken wire region.

Figure 1:
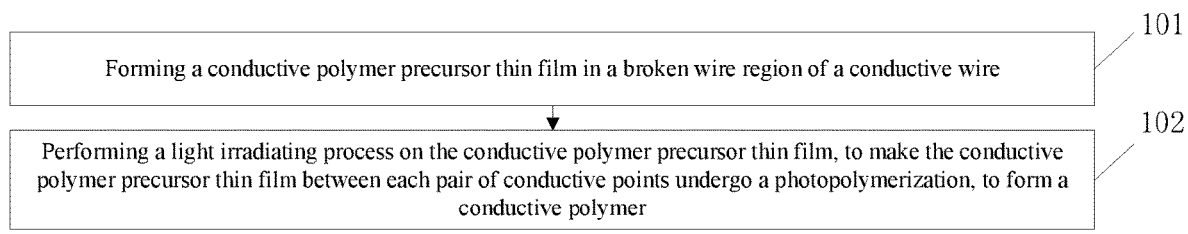
FIG. 1 is a flowchart of a method for repairing a broken wire provided by an embodiment of the present disclosure.

FIG. 1 is a flowchart of a method for repairing a broken wire provided by an embodiment of the present disclosure, and referring to FIG. 1, the method includes:

Step 101: forming a conductive polymer precursor thin film in a broken wire region of a conductive wire, the broken wire region including at least one pair of conductive points, each pair of conductive points including two conductive points disconnected from each other, and the conductive polymer precursor thin film being in direct contact with at least one pair of conductive points.

Here, the conductive polymer precursor thin film per se is, for example, a liquid film that is not electrically conductive. Thus, although at least one pair of conductive points are physically connected through the conductive polymer precursor thin film, the at least one pair of conductive points are not electrically connected at this time. In the embodiment of the present disclosure, the conductive wire may be a signal line or an electrode on a substrate in a display panel, for example, the conductive wire may be made of metal or Indium Tin Oxide (ITO), such as a gate line, a data line, a common line, or a gate electrode, a source-drain electrode on an array substrate (including a top gate type and a bottom gate type). When the above-mentioned conductive wire has been broken, the method for repairing the broken wire provided by the embodiment of the present disclosure may be used for repairing.

In step 101, the disconnection means that there is no electrical connection, and in the embodiment of the present disclosure, a conductive polymer precursor thin film is arranged between two conductive points disconnected from each other, and the conductive polymer precursor thin film is photo-polymerized by irradiating with light, and then a conductive polymer that is electrically conductive is generated, resulting in an electrical connection between the two conductive points.

For example, two conductive points are generated on each broken position of the conductive wire, and the two conductive points form a pair. A broken wire region may only include one pair of conductive points or a plurality of pairs of conductive points. When the broken wire region includes a plurality of pairs of conductive points, the plurality of pairs of conductive points may be conductive points on one conductive wire or conductive points on two or more conductive wires.

In forming the conductive polymer precursor thin film, the conductive polymer precursor thin film may only cover the broken wire region; for example, only the conductive points and a region between each pair of conductive points (such as a strip-shaped region) are covered; at this time, the conductive polymer precursor thin film may be either a whole piece or composed of a plurality of portions independent to each other, and such implementation mode may save materials of the conductive polymer precursor thin film. The conductive polymer precursor thin film may also cover the entire substrate, and such implementation mode may ensure that fabrication of the conductive polymer precursor thin film is simple enough.

In the embodiment of the present disclosure, the forming a conductive polymer precursor thin film in the broken wire region of the conductive wire includes two cases as follows: in a first case, the conductive polymer precursor thin film is directly formed on the conductive wire, and in this case, generally, it is found that the conductive wire is broken after the conductive wire has been fabricated, and at this time, the conductive polymer precursor thin film may be directly fabricated on the conductive wire for repairing the broken conductive wire.

In a second case, the conductive polymer precursor thin film is formed on an insulating layer, and the insulating layer is covered on the conductive wire, and in this case, generally, it is found that the conductive wire is broken after the conductive wire and the insulating layer on the conductive wire have been fabricated, and at this time, the conductive polymer precursor thin film needs to be fabricated on the insulating layer. For example, when the insulating layer is covered on the broken wire, the forming a conductive polymer precursor thin film in the broken wire region of the conductive wire includes: forming at least one pair of via holes on the insulating layer, at least one pair of via holes and at least one pair of conductive points are arranged in one-to-one correspondence, each pair of via holes is used for exposing one pair of conductive points corresponding thereto; and forming a conductive polymer precursor thin film on the insulating layer, the conductive polymer precursor thin film being in contact with at least one pair of conductive points through at least one pair of via holes. When there is the insulating layer on the broken wire, the broken wire and the conductive polymer precursor thin film may be connected by fabricating a via hole, so that the thin film may be directly fabricated on the insulating layer to repair the broken wire.

The forming the via holes on the insulating layer may be realized by etching the insulating layer, and the etching process is a mature process, which will not be repeated herein.

In both cases described above, the conductive polymer precursor thin film may be formed by knife coating, spin coating or other thin film forming methods.

In an implementation mode of the embodiment of the present disclosure, the conductive polymer precursor thin film includes a conductive polymer precursor material; and the conductive polymer precursor material includes a mixture of benzothiophene monomer, carbon tetrachloride, tetrabutylammonium bromide and a solvent. Here, the benzothiophene monomer is a main component for forming a polymer, the carbon tetrachloride is a dispersing agent, and the tetrabutylammonium bromide is a surfactant. The conductive polymer precursor material with such components can undergo a photopolymerization without a photoinitiator, but a long period of light irradiating is needed for reacting, and the reaction process is relatively slow. The surfactant is added to the components in order to avoid agglomeration of the thiophene polymer produced by the photopolymerization, thereby obtaining a thin film having a thickness at a micrometer scale. Here, the solvent may be acetonitrile (MeCN). In the conductive polymer precursor material described above, a molar ratio of the benzothiophene monomer, the carbon tetrachloride and the tetrabutylammonium bromide may be 10:0.1:1.

In another implementation mode of the embodiment of the present disclosure, the conductive polymer precursor thin film includes a conductive polymer precursor material, and the conductive polymer precursor material may include a mixture of a photoinitiator, epoxide, alkyl vinyl ether and thiophene monomer. Here, the thiophene monomer is a main component for forming a polymer, and the epoxide and the alkyl vinyl ether function as a solvent and a dispersing agent together, so that the reaction may be sufficiently carried out.

Herein, the photoinitiator may generally be any one of diaryliodonium salt ($Ar_2I^+X^-$), triarylsulfonium salt ($Ar_3S^+X^-$) and alkoxypyridinium salt ($EMP^+X^-$), where, $X^- = SbF_6^-$, $PF_6^-$, $AsF_6^-$ and the like.

A process of photopolymerization of the conductive polymer precursor material of such components is as follows:

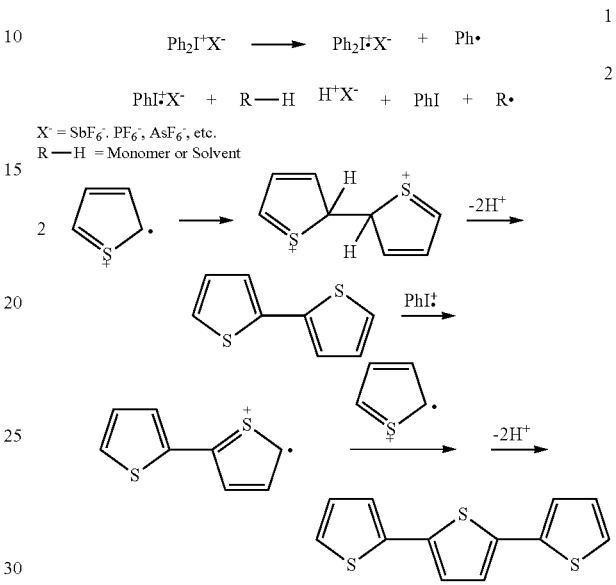

Where, Monomer refers to a monomer, and Solvent refers to a solvent.

Ar in $Ar_2I^+X^-$ denotes an aromatic group, Ph denotes a phenyl group, and the phenyl is one kind of aromatic group.

The epoxide and alkyl vinyl ether in the components described above are auxiliaries for photopolymerization reaction, and oxidizing properties thereof contribute to carry out the photopolymerization, but the epoxide and the alkyl vinyl ether are not essential components, for example, the thiophene monomer and the photoinitiator may be mixed in a dichloroethylene solvent at a molar ratio of 10:1, which may be irradiated with ultraviolet light having a wavelength of 300 nm in a nitrogen atmosphere, and thus a polythiophene thin film may be obtained.

In both of the implementation modes described above, the conductive polymer precursor thin film may further include an organic resin mixed with the conductive polymer precursor material. The organic resin is carbonized by irradiating with light, so as to enhance electrical conductivity of a connecting line.

Herein, a mass ratio of the conductive polymer precursor material to the organic resin may be 1:2 to 2:1. If the resin content is too low, enhancement of the electrical conductivity is not obvious; if the resin content is too high, the mixture of the conductive polymer precursor material and the organic resin may be too thin, affecting forming the thin film. Therefore, the ratio of the conductive polymer precursor material to the organic resin described above is used in the embodiment of the present disclosure.

Step 102: performing a light irradiating process on the conductive polymer precursor thin film, to make the conductive polymer precursor thin film between each pair of conductive points have a photopolymerization, to form a conductive polymer.

In the embodiment of the present disclosure, the performing THE light irradiating process on the conductive polymer precursor thin film may include: making a light spot formed by irradiating the conductive polymer precursor thin film with a linear light source move along a connecting line between each pair of conductive points, and irradiating the conductive polymer precursor thin film, i.e., irradiating the connecting line between each pair of conductive points. Here, a shape of the connecting line between each pair of conductive points is not limited, which may be a straight line or a folded line. Only the connecting line between each pair of conductive points is irradiated to ensure that the formed conductive wire do not affect performances of peripheral pixel units.

It should be noted that, when the conductive polymer precursor thin film is formed in the second case, that is, when the conductive polymer precursor thin film is formed on the insulating layer, the moving the light spot along the connecting line between one pair of the conductive points actually is moving the light spot along the via holes corresponding to one pair of conductive points.

For example, when there are a plurality of pairs of conductive points, it may be realized by means of irradiating with light by many times, for example, after a connecting line between one pair of conductive points is irradiated, the line light source is turned off, and then a connecting line between another pair of conductive points is irradiated, and the above steps are repeated until the connecting line between each pair of conductive points are irradiated.

Herein, the line light source may be an ultraviolet light source or a laser light source. The use of the ultraviolet light source or the laser light source consumes less energy, which is environmentally friendly and has a fast polymerizing rate.

After the conductive polymer precursor thin film is irradiated with light, the benzothiophene monomer or the thiophene monomer are gradually polymerized, and conductivity and solubility thereof are changed greatly: from a non-conductive monomer to a conductive long-chain structure, from a solvent-soluble monomer to an insoluble polymer. Therefore, after the light irradiating and the polymerization have occurred, the conductive polymer precursor thin film which is not irradiated with light, has no conductivity and has good solubility may be removed, only the conductive material irradiated by light and good in conductivity and insoluble is left, thereby generating a specific conductive wire to connect the two conductive points.

Optionally, the method can further include: removing the unirradiated portion of the conductive polymer precursor thin film. Since the unirradiated portion of the conductive polymer precursor thin film does not undergo photopolymerization, this portion is non-conductive, has good solubility, and may be removed.

Further, the removing the unirradiated portion of the conductive polymer precursor thin film can include: washing the conductive polymer precursor thin film irradiated with light by using an organism stripping solution, to remove the unirradiated portion of the conductive polymer precursor thin film. Since the unirradiated portion of the conductive polymer precursor thin film does not undergo photopolymerization, this portion has good solubility, and may be washed away by the organic stripping solution.

Figure 2:
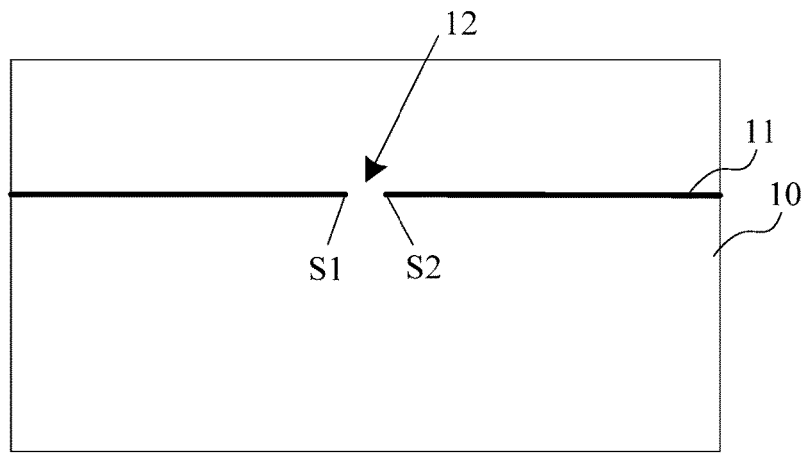
FIG. 2 is a schematic diagram of a process of repairing a broken wire provided by an embodiment of the present disclosure.
Figure 3:
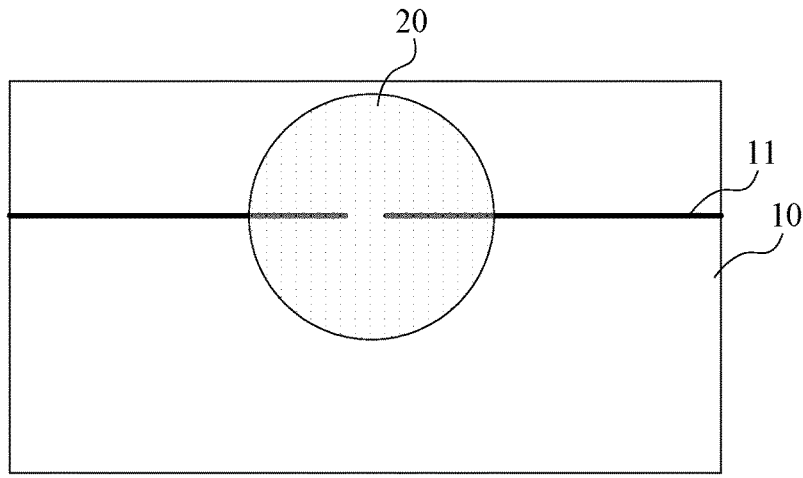
FIG. 3 is a schematic diagram of a process of repairing a broken wire provided by an embodiment of the present disclosure.
Figure 4:
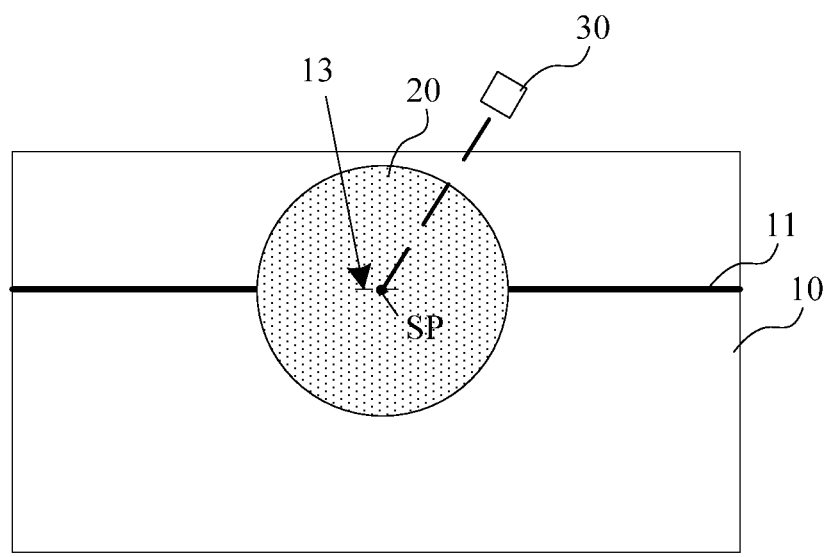
FIG. 4 is a schematic diagram of a process of repairing a broken wire provided by an embodiment of the present disclosure.

FIG. 2 to FIG. 6 are schematic diagrams of a process of repairing a broken wire provided by an embodiment of the present disclosure (one pair of conductive points are taken as an example in the diagrams), and the method for repairing a broken wire provided by the embodiment of the present disclosure is further explained in conjunction with FIG. 2 to FIG. 6:

As shown in FIG. 2, a conductive wire 11 on a substrate 10 is disconnected at a position 12, so that there are two conductive points S1 and S2 (abbreviated as conductive points S1 and S2);

In repairing the broken wire, a conductive polymer precursor thin film 20 is formed first, and the conductive polymer precursor thin film 20 is in direct contact with the two conductive points S1 and S2 disconnected at the position 12, as shown in FIG. 3;

Then, a light source 30 irradiates the conductive polymer precursor thin film 20 in a direction of a straight connecting line 13 of the two conductive points S1 and S2, as shown in FIG. 4;

Here, a light source 30, for example, may generate a linear light beam, and the linear light beam forms a spot SP on the conductive polymer precursor thin film 20.

For example, a minimum size of the spot SP formed by the line light source 30 on the conductive polymer precursor thin film 20 is larger than a line width of the conductive wire 11.

For example, a maximum size of the spot SP formed by the line light source 30 on the conductive polymer precursor thin film 20 is less than or equal to twice of the line width of the conductive wire 11.

Figure 5:
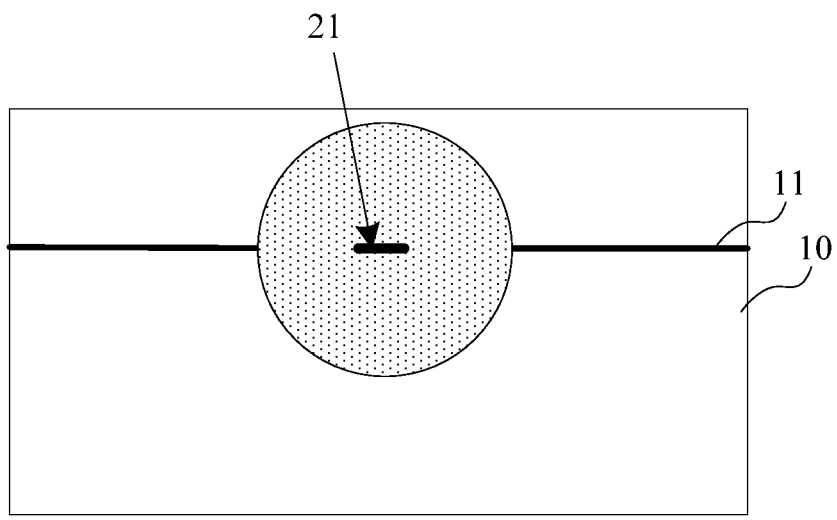
FIG. 5 is a schematic diagram of a process of repairing a broken wire provided by an embodiment of the present disclosure.
Figure 6:
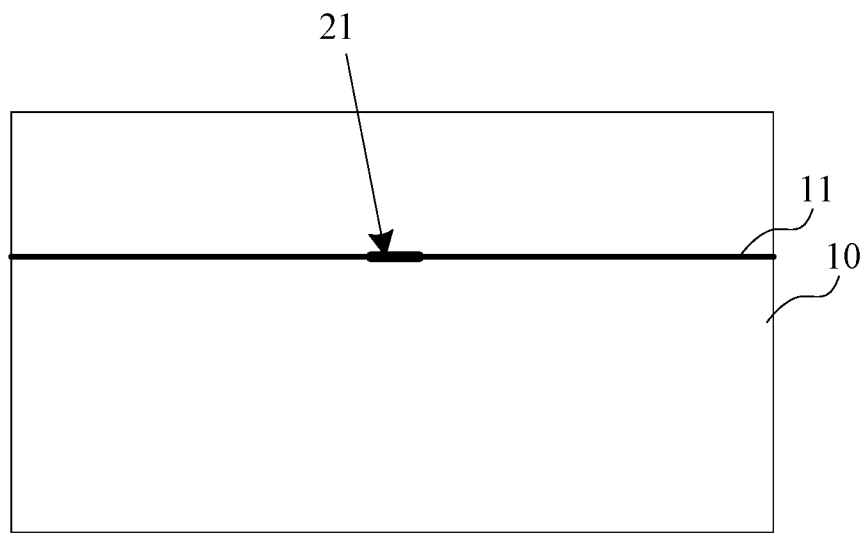
FIG. 6 is a schematic diagram of a process of repairing a broken wire provided by an embodiment of the present disclosure.

A portion of the conductive polymer precursor thin film 20 irradiated by the light source 30 is photopolymerized to form a conductive polymer 21, and as shown in FIG. 5, the conductive polymer 21 is electrically conductive, so that the broken wire may be connected;

Finally, the portion of the conductive polymer precursor thin film 20 without being irradiated with the light source 30 is removed, and only the conductive polymer 21 is left, as shown in FIG. 6.

Figure 7:
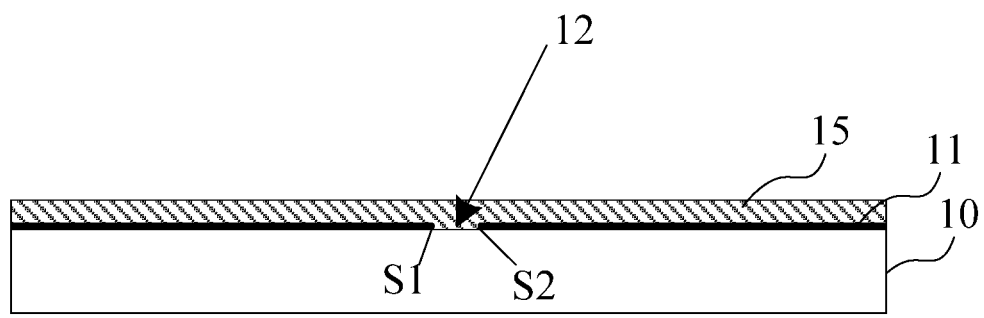
FIG. 7 is a schematic diagram of another process of repairing a broken wire provided by an embodiment of the present disclosure.
Figure 8:
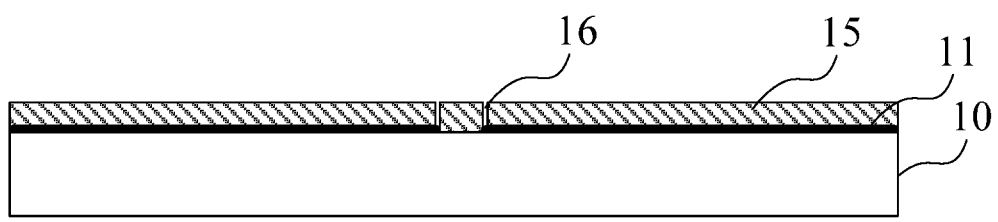
FIG. 8 is a schematic diagram of another process of repairing a broken wire provided by an embodiment of the present disclosure.
Figure 9:
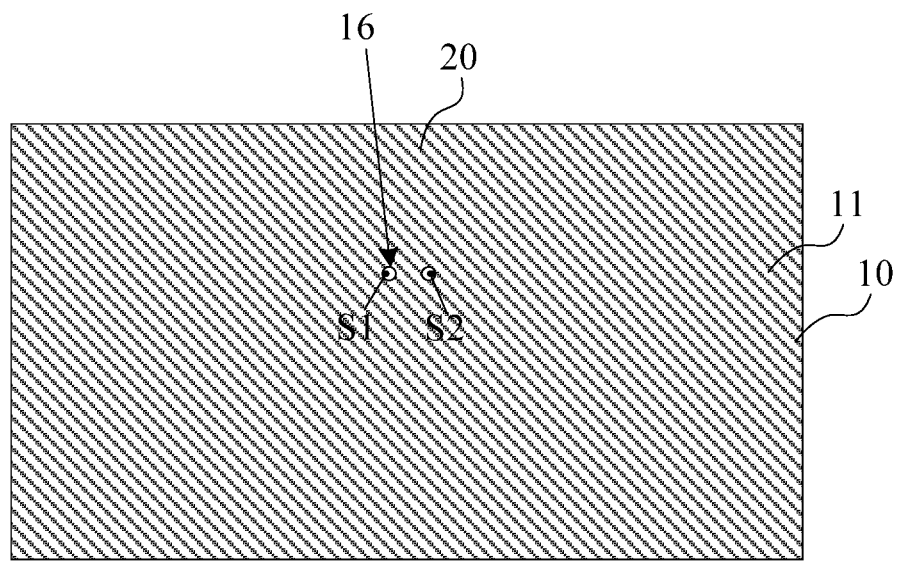
FIG. 9 is a schematic diagram of another process of repairing a broken wire provided by an embodiment of the present disclosure.
Figure 10:
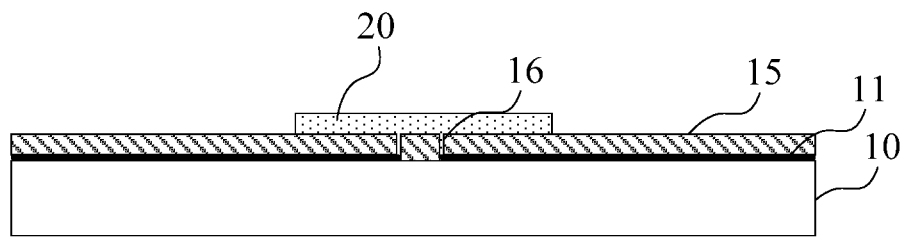
FIG. 10 is a schematic diagram of another process of repairing a broken wire provided by an embodiment of the present disclosure.
Figure 11:
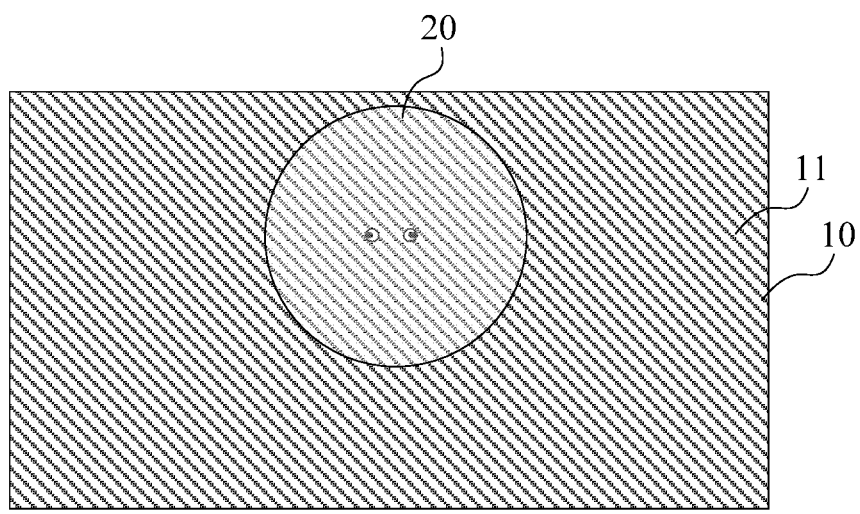
FIG. 11 is a schematic diagram of another process of repairing a broken wire provided by an embodiment of the present disclosure.
Figure 12:
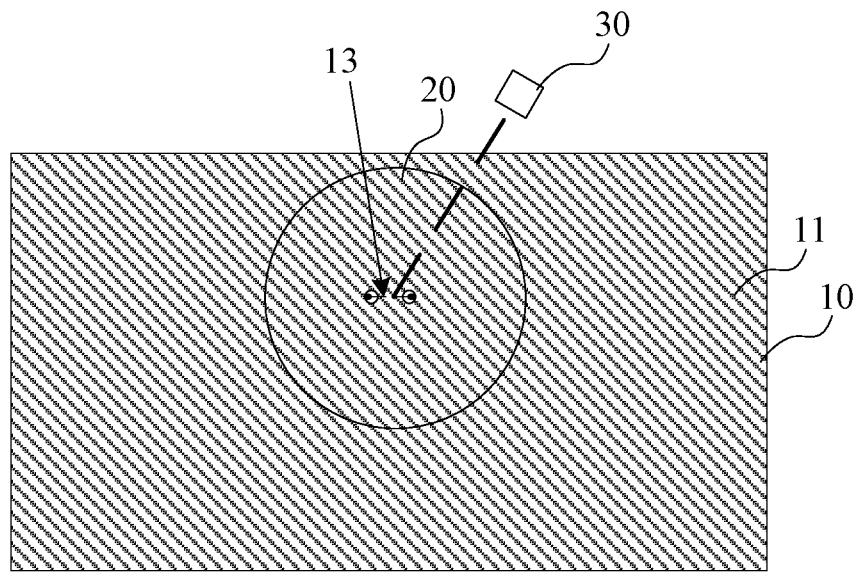
FIG. 12 is a schematic diagram of another process of repairing a broken wire provided by an embodiment of the present disclosure.
Figure 13:
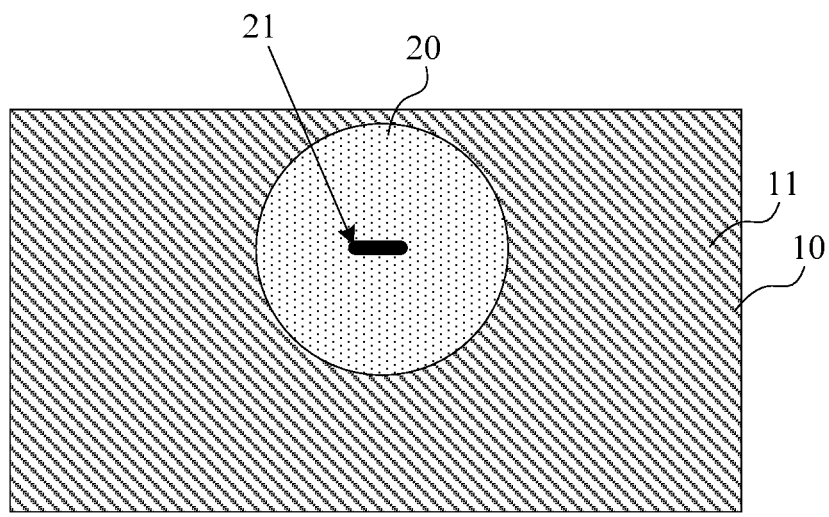
FIG. 13 is a schematic diagram of another process of repairing a broken wire provided by an embodiment of the present disclosure.
Figure 14:
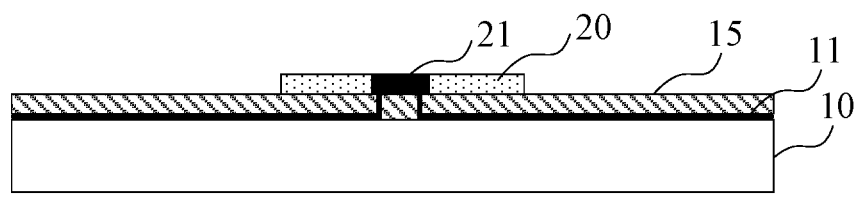
FIG. 14 is a schematic diagram of another process of repairing a broken wire provided by an embodiment of the present disclosure.

FIG. 7 to FIG. 16 are schematic diagrams of another process of repairing a broken wire provided by an embodiment of the present disclosure (one pair of conductive points are taken as an example in the diagrams). A difference between the process of repairing the broken wire shown in FIG. 2 to FIG. 6 is that, an insulating layer presents on the conductive wire, and the method for repairing a broken wire provided by the embodiment of the present disclosure is further explained in conjunction with FIG. 7 to FIG. 16:

As shown in FIG. 7, a conductive wire 11 on a substrate 10 is disconnected at a position 12, so that there are two conductive points S1 and S2, and the conductive wire 11 is covered with an insulating layer 15;

In repairing the broken wire, two via holes 16 are formed in the insulating layer 15 at first, and the two via holes 16 are exactly exposed the two conductive points S1 and S2 which are disconnected at the position 12, as shown in FIGS. 8 and 9;

A conductive polymer precursor thin film 20 is formed on the insulating layer 15 with the via holes 16 formed therein; the conductive polymer precursor thin film 20, through the two via holes 16, is in direct contact with the two conductive points S1 and S2 which are disconnected at the position 12, as shown in FIGS. 10 and 11;

Then, a light source 30 irradiates the conductive polymer precursor thin film 20 along a direction of a straight connecting line 13 of the two conductive points S1 and S2, as shown in FIG. 12; a portion of the conductive polymer precursor thin film 20 irradiated by the light source 30 is photopolymerized to form a conductive polymer 21, and as shown in FIGS. 13 and 14, the conductive polymer 21 is electrically conductive, so that the broken wire can be connected.

Figure 15:
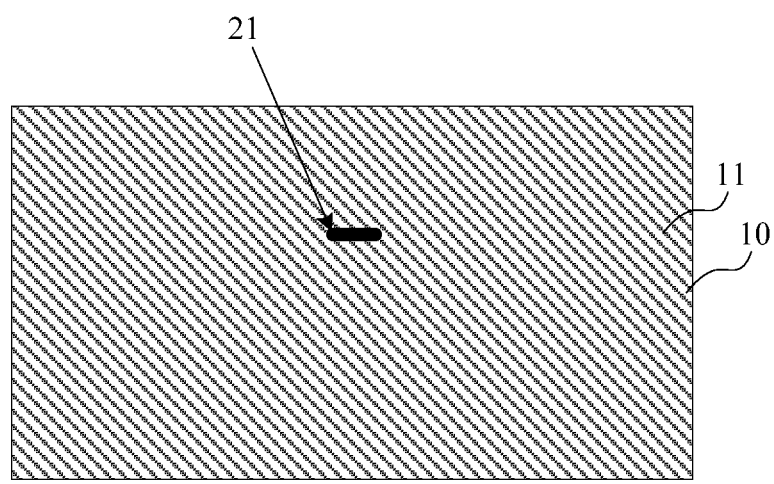
FIG. 15 is a schematic diagram of another process of repairing a broken wire provided by an embodiment of the present disclosure.
Figure 16:
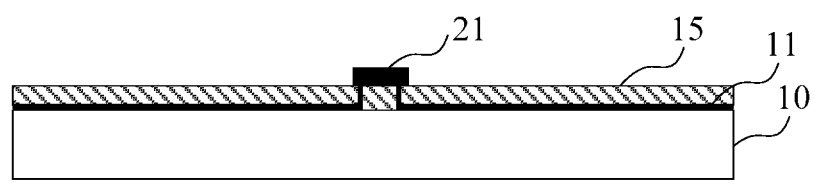
FIG. 16 is a schematic diagram of another process of repairing a broken wire provided by an embodiment of the present disclosure.

For example, a staying time of the light spot SP generated by the light source 30 at the positions of the two via holes 16 is, for example, at least 3 times greater than a staying time at other positions of the straight connecting line 13, so that a portion of the conductive polymer precursor thin film 20 located in the via holes 16 is sufficiently photopolymerized to form a conductive polymer;

Finally, the portion of the conductive polymer precursor thin film 20 without being irradiated with the light source 30 is removed, and only the conductive polymer 21 is left, as shown in FIGS. 15 and 16.

In the wire repairing of the embodiment of the present disclosure, first a conductive polymer precursor thin film is formed (a conductive polymer precursor is a precursor substance for forming the conductive polymer), the thin film being connected with at least one pair of conductive points of the broken wire; and then the conductive polymer precursor thin film is photopolymerized by irradiating with light to form a conductive polymer, thereby generating a conductive polymer line between each pair of conductive points to connect each pair of conductive points, so as to repair a circuit, which is able to quickly repair a function failure of the substrate caused by disconnection of the conductive wire. Laser chemical vapor deposition is not required here, so that the repairing cost is low, the repairing time is short. Since only the light irradiating process is required in the repairing process, and the processes such as the laser chemical vapor deposition, the laser welding and the like are not required, performances of pixel units around the broken wire region may not be affected.

An embodiment of the present disclosure further provides a substrate, and the substrate includes: a conductive wire, the conductive wire including at least one pair of conductive points, each pair of conductive points including two conductive points, and each pair of conductive points being connected through a conductive polymer.

The broken wire of the substrate provided by the embodiment of the present disclosure is connected through the conductive polymer, and the conductive polymer can be generated by photopolymerizing a conductive polymer precursor with light, so that the circuit can be repaired by photopolymerizing the conductive polymer precursor when there is a broken wire on the substrate, which is able to quickly repair a function failure of the substrate caused by disconnection of the conductive wire. Laser chemical vapor deposition is not required here, so that the repairing cost is low, the repairing time is short. Since only the light irradiating process is required in the repair process, and the processes such as the laser chemical vapor deposition, the laser welding and the like are not required, performances of pixel units around the broken wire region may not be affected.

In the embodiment of the present disclosure, a position of the conductive polymer includes two types: a first type: the conductive wire and the conductive polymer are disposed in a same layer, and the conductive polymer is located between the conductive points of the conductive wire. A second type: the conductive wire and the conductive polymer are arranged in different layers, for example, the conductive polymer is arranged on an insulating layer of the conductive wire, and at this time, the insulating layer is provided with via holes corresponding to the conductive points of the conductive wire, and the conductive polymer is connected with the conductive points of the conductive wire through the via holes.

In an implementation mode of the embodiment of the present disclosure, the conductive polymer may be obtained by irradiating a mixture of benzothiophene monomer, carbon tetrachloride, tetrabutylammonium bromide and a solvent with light. Here, the benzothiophene monomer is a main component for forming a polymer, the carbon tetrachloride is a dispersing agent, and the tetrabutylammonium bromide is a surfactant, and the conductive polymer precursor material of the components may have a photopolymerization without a photoinitiator, but a long period of light irradiation is needed to react, and the reaction process is relatively slow, and the surfactant is added to the components in order to avoid agglomeration of the thiophene polymer produced by the photopolymerization, thereby obtaining a thin film having a thickness at a micrometer scale. Here, the solvent may be acetonitrile (MeCN). In the conductive polymer precursor material described above, a molar ratio of the benzothiophene monomer, the carbon tetrachloride and the tetrabutylammonium bromide may be 10:0.1:1.

In another implementation mode of the embodiments of the present disclosure, the conductive polymer may be obtained by irradiating a mixture of photoinitiator, epoxide, alkyl vinyl ether and thiophene monomer with light. Here, the thiophene monomer is a main component for forming a polymer, and the epoxide and the alkyl vinyl ether function as a solvent and a dispersing agent together, so that the reaction can be sufficiently carried out.

Herein, the photoinitiator can generally be any one of diaryliodonium salt ($Ar_2I^+X^-$), triarylsulfonium salt ($Ar_3S^+X^-$), and alkoxypyridinium salt ($EMP^+X^-$), where, $X=SbF_6^-$, $PF_6^-$, $AsF_6^-$, and the like.

Of course, the epoxide and the alkyl vinyl ether in the components described above are not essential components, and for example, the thiophene monomer and the photoinitiator may be mixed in a dichloroethylene solvent at a molar ratio of 10:1, and then irradiated with ultraviolet light having a wavelength of 300 nm in a nitrogen atmosphere, to obtain a polythiophene thin film.

In both of the implementation modes, the conductive polymer precursor thin film may further include an organic resin mixed with the conductive polymer precursor material. The organic resin is carbonized by irradiating with light, so as to enhance electrical conductivity of the connecting wire.

Herein, a mass ratio of the conductive polymer precursor material to the organic resin may be 1:2 to 2:1. If the resin content is too low, enhancement of the electrical conductivity is not obvious; and if the resin content is too high, the mixture of the conductive polymer precursor material and the organic resin may be too thin, affecting forming the thin film. Therefore, the ratio of the conductive polymer precursor material to the organic resin described above is adopted in the embodiment of the present disclosure.

In the embodiment of the present disclosure, the conductive wire may be a signal line or an electrode on the substrate, usually made of metal or ITO, for example a gate line, a data line, and a common line, or a gate electrode, a source-drain electrode on the array substrate (including the top gate type and the bottom gate type).

An embodiment of the present disclosure further provides a display device, and the display device includes the substrate described above.

In a specific implementation, the display device provided by the embodiment of the present disclosure can be any product or component having a display function, such as a mobile phone, a tablet computer, a television, a monitor, a notebook computer, a digital photo frame, a navigator and the like.

In the embodiment of the present disclosure, a broken wire of the substrate is connected through a conductive polymer, and the conductive polymer may be generated by photopolymerizing a conductive polymer precursor with light, so that the circuit may be repaired by photopolymerizing the conductive polymer precursor when there is a broken wire on the substrate, which is able to quickly repair a function failure of the substrate caused by disconnection of the conductive wire, and no laser chemical vapor deposition is required here, so that repair cost is low, repair time is short, and since only the light irradiating process is required in the repair process, the processes such as the laser chemical vapor deposition, the laser welding and the like are not required, performances of pixel units around the broken wire region may not be affected.

Although both the conductive points S1 and S2 belong to the conductive wire 11 in the embodiment, it should be understood that in other embodiments, the conductive points S1 and S2 may belong to different conductive wires or may be located in different layers.

The above descriptions are only exemplary embodiments of the present disclosure, and are not intended to limit the present disclosure. Any modifications, equivalents, improvements and the like, which are within the spirit and scope of the present disclosure, should be included in the scope of the present disclosure.

The invention claimed is:

1. An electrical connection method for electrically connecting a first conductive point and a second conductive point separated from each other on a substrate, comprising:
    forming a conductive polymer precursor thin film to physically connect the first conductive point and the second conductive point; and
    performing a polymerizing process on the conductive polymer precursor thin film to form a conductive polymer electrically connecting the first conductive point and the second conductive point;
    wherein performing a light irradiating process on the conductive polymer precursor thin film to form the conductive polymer includes:
    making a light spot formed by irradiating the conductive polymer precursor thin film with a light source move along a connecting line between the first conductive point and the second conductive point;
    the method further comprises:
    removing an unirradiated portion of the conductive polymer precursor thin film;
    wherein removing the unirradiated portion of the conductive polymer precursor thin film includes:
    washing the conductive polymer precursor thin film irradiated with light by using an organism stripping solution.

2. The method according to claim 1, wherein, the first conductive point and the second conductive point belong to a same conductive member.

3. The method according to claim 1, wherein, the conductive polymer precursor thin film is in direct contact with the first conductive point and the second conductive point.

4. The method according to claim 1, wherein, the polymerizing process is a light irradiating process.

5. The method according to claim 1, wherein, the conductive polymer precursor thin film includes a conductive polymer precursor material.

6. The method according to claim 5, wherein, the conductive polymer precursor material includes a mixture of benzothiophene monomer, carbon tetrachloride, tetrabutylammonium bromide and a solvent.

7. The method according to claim 5, wherein, the conductive polymer precursor material includes a mixture of a photoinitiator and thiophene monomer.

8. The method according to claim 5, wherein, the conductive polymer precursor thin film further includes an organic resin mixed with the conductive polymer precursor material.

9. The method according to claim 8, wherein, a mass ratio of the conductive polymer precursor material to the organic resin is about 1:2 to 2:1.

10. The method according to claim 1, wherein, the light source is an ultraviolet light source or a laser light source.

11. The method according to claim 1, wherein, an insulating layer is covered on the first conductive point and the second conductive point, the repairing method further comprising:
    forming a first via hole and a second via hole on the insulating layer before forming the conductive polymer precursor thin film, the first via hole exposing the first conductive point, and the second via hole exposing the second conductive point;
    the conductive polymer precursor thin film physically connecting the first conductive point and the second conductive point through the first via hole and the second via hole.

12. The method according to claim 2, wherein, the conductive member is a gate line, a data line, a common line, a gate electrode or a source-drain electrode.

* * * * *